United States Patent [19]

Uehara et al.

[11] 4,245,154

[45] Jan. 13, 1981

[54] APPARATUS FOR TREATMENT WITH GAS PLASMA

[75] Inventors: Akira Uehara, Yokohama; Hiroyuki Kiyota, Hiratsuka; Hisashi Nakane, Kawasaki; Shozo Toda, Fujisawa, all of Japan

[73] Assignee: Tokyo Ohka Kogyo Kabushiki Kaisha, Kawasaki, Japan

[21] Appl. No.: 919,856

[22] Filed: Jun. 28, 1978

[30] Foreign Application Priority Data

Sep. 24, 1977 [JP] Japan .................... 52-114977

[51] Int. Cl.³ ............................................. G02B 5/14
[52] U.S. Cl. .................................... 250/227; 250/551
[58] Field of Search .............. 350/96.26, 96.25, 96.27; 250/227, 551; 313/231.3

[56] References Cited

U.S. PATENT DOCUMENTS

| | | | |
|---|---|---|---|
| 2,987,960 | 6/1961 | Sheldon | 350/96.26 |
| 3,629,590 | 12/1971 | Case | 250/551 |
| 3,990,778 | 11/1976 | Magee et al. | 350/96.25 |
| 4,011,017 | 3/1977 | Feurstein et al. | 350/96.26 |
| 4,069,838 | 1/1978 | Hansel et al. | 250/227 |

*Primary Examiner*—David C. Nelms
*Attorney, Agent, or Firm*—Brisebois & Kruger

[57] ABSTRACT

An improved apparatus for plasma treatment of silicon semiconductor wafers is proposed in which the end point of the plasma etching or ashing can be readily detected by monitoring with an optical fiberscope penetrating the wall of the plasma reaction chamber with one terminal located inside the plasma reaction chamber with a condenser lens attached thereto and the other terminal located outside the plasma reaction chamber at a distanced position free from the influence of the high frequency electric field inherent to plasma generation which otherwise interferes with the photoelectric recording by the photocell connected to the outer terminal of the optical fiberscope.

9 Claims, 4 Drawing Figures

APPARATUS FOR TREATMENT WITH GAS PLASMA

BACKGROUND OF THE INVENTION

The present invention relates to an apparatus for the precision treatment of a material such as high-purity silicon semiconductor wafers in which a monitoring means for detecting the end point of the plasma reaction is provided.

In the recent development of the semiconductor technology, a dry method of plasma etching is obtaining more and more wide applications in place of the conventional wet etching method with an etching solution giving a possibility of very fine working in the manufacture of ICs, LSIs, ultra-LSIs and the like. In spite of the very apparent advantages of the plasma etching method over the wet method, it is only recently that the method has come into current because of the difficulty in detecting the end point of the etching by the plasma reaction as a major problem.

Attempts have been made for monitoring the progress of the plasma reaction by spectrophotometrically recording the light emitted from the plasma through a window in the plasma reaction chamber with an expensive equipment composed of a grating spectrometer and a photomultiplier recording system (see W. R. Harshbarger et al., Kodak Microelectronics Seminar, October, 1976).

SUMMARY OF THE INVENTION

It is therefore an object of the present invention to provide an improved apparatus for the plasma treatment of a wafer having a monitoring means for detecting the end point of the plasma reaction.

The present invention relates to a novel apparatus for the treatment of a material, e.g. a wafer of silicon semiconductor, placed under reduced pressure in a plasma reaction chamber by a low temperature gas plasma generated by applying a high frequency voltage between electrodes with an improvement which comprises providing the plasma reaction chamber with an optical fiberscope penetrating the wall of the plasma reaction chamber with vacuum-tight sealing, one terminal of the optical fiberscope being located inside the plasma reaction chamber with a condenser lens attached thereto and the other terminal of the optical fiberscope being located outside the plasma reaction chamber at a distanced position free from the influence of the high frequency electric field and connected to a photoelectric transducer means.

DETAILED DESCRIPTION OF THE PREFERRED EMBODIMENTS

Figure 1:
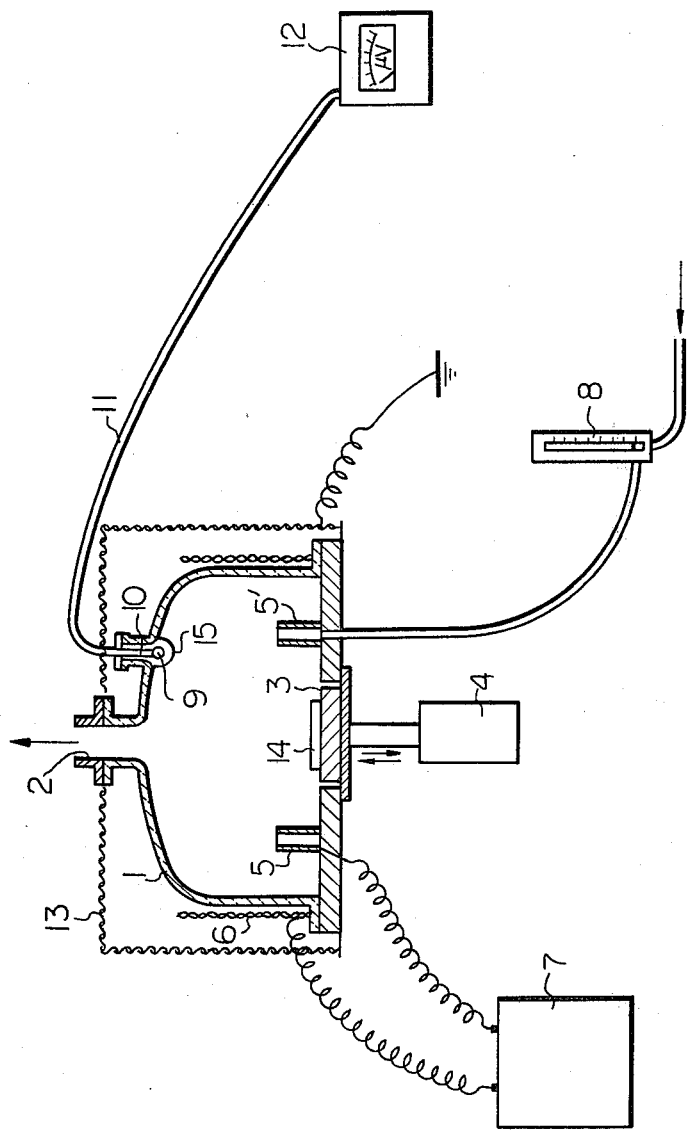
FIG. 1 is a cross-sectional side view of the inventive apparatus.

The apparatus of the present invention is completed in principle on the basis of the discovery that, while the plasma etching reaction is under progress, the plasma gas is consumed at a substantially constant rate to maintain the constant amount of the plasma gas inside the chamber while, when the plasma reaction comes near to the end, the amount of the plasma gas remaining in the chamber begins to rapidly increase owing to the decrease in the rate of the plasma gas consumption bringing about an increase in the intensity of the light emitted from the plasma which is detectable even with an inexpensive photoelectric transducer means such as a photocell.

A photocell is a well known photoelectric detector means for converting the intensity of light into electric current or EMF. It is, however, impractical to use a photocell placed inside the plasma reaction chamber as a detector for the variation of the light intensity emitted from the plasma with the monitoring purpose to detect the end point of the plasma reaction because, with such an arrangement of the photocell, the very weak photoelectromotive force obtained by the photocell is inevitably under the influence of the overlapping high frequency electric field for the plasma generation leading to serious errors in the photoelectric signals.

In the improved apparatus of the present invention, the light emitted from the plasma inside the plasma reaction chamber is collected and projected by a condenser lens on to the terminal surface of an optical fiberscope located inside the chamber to which the condenser lens is attached. The light entering the optical fiberscope traverses the optical fiberscope which penetrates the wall of the plasma reaction chamber with vacuum-tight sealing with the other terminal located outside the plasma reaction chamber at a distanced position free from the influence of the high frequency electric field where the optical fiberscope is connected to a photoelectric transducer means such as a photocell. By this arrangement of the condenser lens, the optical fiberscope and the photoelectric transducer means in accordance with the present invention, any small changes in the intensity of the light within a wide wavelength range emitted from the plasma is detectable without being disturbed by the high frequency electric field inherent to the plasma generation.

A preferred embodiment of the inventive apparatus is now explained with reference to FIG. 1.

In the figure, 1 is a plasma reaction chamber with a dome-like covering, preferably, made of fused quartz glass connected to a vacuum line at the opening 2 on the top of it. In the bottom of the plasma reaction chamber is provided a wafer table 3 supported by an elevator cylinder 4 to ensure the up and down movement of the wafer table 3 so as that the wafer table 3 can be vacuum-tightly attached to the bottom of the plasma reaction chamber when it is in the uppermost position and a wafer 14 under treatment is easily mounted on or dismounted from the wafer table 3 in the lowered position. Inside the plasma reaction chamber 1, 5, 5' are high frequency electrodes as the counterelectrodes of the grounded high frequency electrode 6 outside the plasma reaction chamber 1 connected to a high frequency generator 7. Optionally, the electrodes 5, 5' have openings and serve as nozzles for the introduction of the plasma gas by being connected to the gas line leading to a gas source through a gas flowmeter 8.

The optical fiberscope 11 penetrating the wall of the plasma reaction chamber at the top has one of its terminals inside the plasma reaction chamber 1 with a condenser lens 9 attached thereto. The other terminal of the optical fiberscope 11 located outside the plasma reaction chamber 1 is connected to a photocell to detect the light reaching it through the optical fiberscope 11 and the signals of the photoelectromotive force produced in the photocell is directly read on the microvoltammeter 12. It is of course that the penetration of the optical fiberscope 11 through the wall of the plasma reaction chamber 1 must be vacuum-tight. The plasma reaction chamber 1 is surrounded by a grounded cage of wire netting 13 or a box cabinet of metal to shield the high frequency electric field for preventing the interference with the photoelectric detection system.

The procedure for the plasma treatment of a wafer by use of the thus constructed inventive apparatus is now described below.

A wafer material 14 to be treated is mounted on the wafer table 3 at its lowered position and the table 3 is elevated by driving the elevator cylinder 4 until the table 3 comes into vacuum-tight contact with the bottom opening of the plasma reaction chamber 1. The plasma reaction chamber 1 with a wafer 14 under treatment mounted on the wafer table 3 in its uppermost position is evacuated and filled with a small amount of the plasma gas introduced from the gas nozzles 5, 5' and a high frequency voltage is applied between the electrodes 5, 5' and the counterelectrode 6 to generate plasma inside the plasma reaction chamber 1 with which the plasma treatment of the wafer 14 is effected. The light emitted from the plasma inside the plasma reaction chamber 1 is collected by the condenser lens 9 and, on entering the optical fiberscope 11 at the terminal and traversing it, reaches the photocell located at a distanced position with no influence of the high frequency electric field, where a photoelectric signal is produced without distortion by the interfering high frequency electric field and read on the microvoltammeter 12. The wire netting 13 is helpful for complete shielding of the high frequency electric field. After completion of the plasma reaction, the end point of which can be readily determined by recording the photoelectric signals obtained in the photocell, the wafer table 3 is lowered by driving the elevator cylinder 4 and the plasma-treated wafer material 14 is taken from the wafer table 3.

The condenser lens 9 contributes to the improvement of the photoelectric detection sensitivity for a very small variation of the light intensity by projecting intensified light on the terminal of the optical fiberscope 11 regardless of the wavelength of the light. It is recommended that the condenser lens 9 is sealed with a detachable covering 15 of a transparent material, e.g. fused quarts glass, and, when the covering 15 becomes cloudy after prolonged use in contact with the plasma, it is detached and cleaned or replaced with new one.

Several variations are possible in the disposition of the electrodes. For example, one of the counterelectrodes can be inside the plasma reaction chamber and the other outside the chamber as described above, or, alternatively, both of the counterelectrodes are provided either inside or outside of the plasma reaction chamber.

As is described above, the apparatus of the present invention is advantageous owing to the simplicity of its construction and the reliability in its operation as well as in its inexpensiveness. It is versatile even in remodeling of ready-made apparatuses of the kind and, in particular, very remarkable advantages are obtained when it is combined with an automatic apparatus for the continuous one-by-one treatment of wafers as disclosed in the copending applications by some of the inventors in ensuring well controlled intervals for the supply of the successive wafers.

Following are the examples to illustrate the apparatus of the present invention and its use in further detail.

EXAMPLE 1

Figure 2:
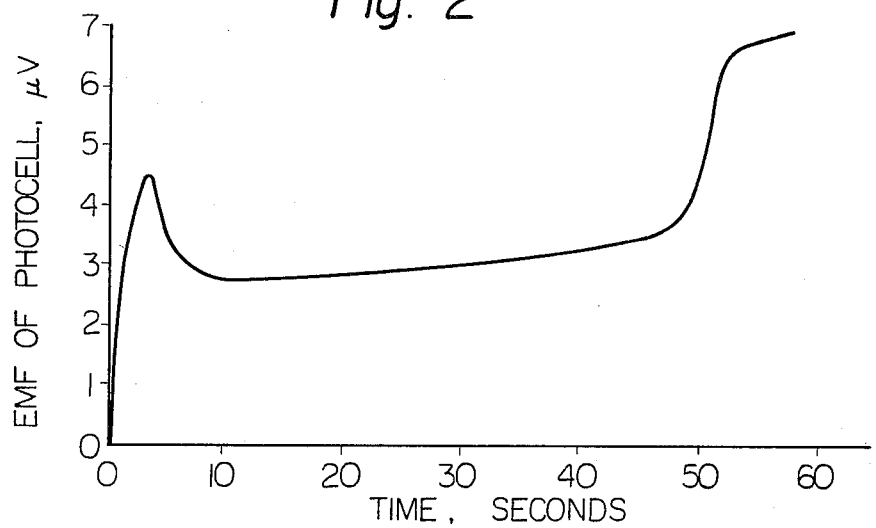
FIGS. 2 to 4 are the plots of the photoelectromotive force in microvolts of the photocell as the photoelectric transducer means as a function of the plasma reaction time in seconds.

A high-purity silicon wafer of 8 cm diameter with successive surface layers of underlying silicon monoxide and top layer of polycrystalline silicon of about 1 $\mu$m thickness was placed without a resist pattern on the wafer table of an apparatus as shown in FIG. 1 heated at 100° C. and carbon tetrafluoride gas was introduced at a rate of 1 liter (N.T.P.)/minute through the gas flowmeter while decreasing the pressure inside the chamber to 0.1 mmHg where a high frequency voltage of 3000 volts was applied between the electrodes by use of a high frequency generator operating at a frequency of 13.56 MHz with a power output of 150 watts to produce plasma of carbon tetrafluoride. The thus porduced fluoride plasma was consumed in the fluorination of the silicon to finally establish a stationary state. The light emitted from the fluorine plasma was led to the photocell through the condenser lens and the optical fiberscope penetrating the chamber wall as shown in the figure. The photocell was, being positioned at a distance of about 1 meter from the plasma reaction chamber, free from any interference of the high frequency electric field. The curve in FIG. 2 is a plot of the photoelectromotive force as recorded taking the time of the plasma reaction as abscissa.

As is clear from the figure, the photoelectromotive force, viz. the light intensity, sharply increased in the beginning several seconds after the application of the high frequency voltage reaching a maximum followed by falling to a stationary value of about 3 to 4 microvolts lasting for 40 to 50 seconds from the beginning. When the plasma reaction came near to completion, the photoelectromotive force began again to increase rapidly reaching a value as high as 7 microvolts where it levelled off.

By observing this levelling off of the photoelectomotive force, the high frequency generator was deactivated at a moment of about 57 seconds from the beginning for taking the plasma-treated wafer out of the chamber to find that the plasma etching on the surface was very even with a uniform depth.

EXAMPLE 2

A similar silicon wafer of 8 cm diameter to that used in Example 1 was provided with an image-wise pattern of a photoresist (OMR-83, product of Tokyo Ohka Kogyo Co., Ltd., Japan) by use of a lattice-wise test pattern of 5 $\mu$m line widths and 5 $\mu$m line intervals. The wafer was subjected to the plasma treatment in the same conditions and in the same appratus as in Example 1 to find the rapid increase in the photoelectromotive force after 43 seconds from the beginning where the high frequency generator was deactivated. The depth of etching in the resultant wafer was very uniform and the etched pattern was a reproduction of the test pattern with high fidelity with the identical line width as in the photoresist pattern free from any side etching.

EXAMPLE 3

Figure 3:
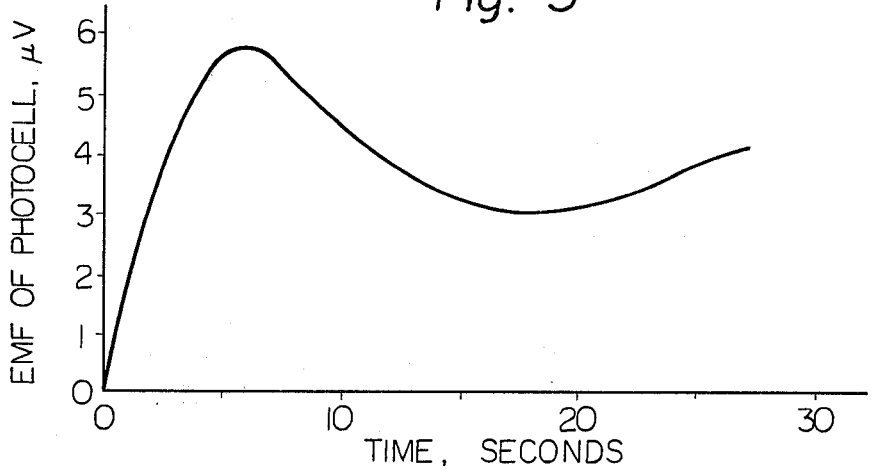

A high purity silicon wafer of 8 cm diameter with successive surface layers of underlying silicon monoxide and top layer of about 0.8 $\mu$m thick silicon nitride was subjected to the etching treatment with fluorine plasma from carbon tetrafuoride in the same appratus as used in Example 1. The photoelectromotive force as a function of the reaction time is shown in FIG. 3. In this case, the somewhat delayed beginning of the etching of the nitride resulted in the appearance of the maximum in the photoelectromotive force only after about 5 seconds from the start with a peak valve of 5 to 6 microvolts followed by the decrease until 20 seconds due to the consumption of the fluorine plasma. Further application of the high frequency voltage resulted again in the increase of the photoelectromotive force indicating the completion of the plasma etching.

EXAMPLE 4

Figure 4:
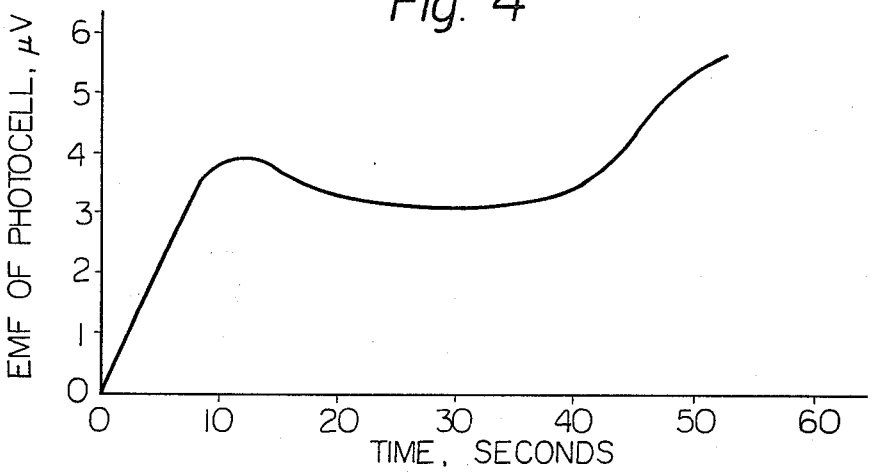

Removal by ashing of the photoresist on the silicon wafer subjected to etching in Example 2 above was carried out by placing the wafer in the same appratus into which oxygen was introduced at a rate of 1 liter (N.T.P.)/minute instead of carbon tetrafluoride with the pressure inside the chamber decreasing to 3 mmHg. The temperature of the wafer table was 150° C. and the power output of the high frequency generator was 200 watts. Owing to the overlapping of the wavelengths 700 to 940 nm of the light emitted from oxygen plasma with the wavelengths 700 to 850 nm from fluorine plasma, the same photocell could be used as in Example 2. While recording the photoelectromotive force obtained by the apparatus as shown in FIG. 4, the treatment was terminated after 52 seconds from the start to take out the wafer. It was found that the photoresist on the surface of the wafer had been removed very evenly and that the wafer had received almost no plasma damage.

What is claimed is:

1. Plasma treatment apparatus for treatment of silicon semiconductor wafers and the like comprising
    a plasma reaction chamber having an inlet for plasma forming gas and an outlet for connection to a vacuum source,
    means for supporting a semiconductor wafer during plasma treatment and comprising,
    a wafer table located within said chamber and being movable between upper and lower positions relative to said chamber.
    high frequency electrode means associated with said chamber and connected to a high frequency generator for creating plasma within said chamber,
    an optical fiberscope having first and second terminals, said first terminal penetrating a wall of the chamber and said second terminal being connected to a photoelectric transducer means for detecting light intensity, said second terminal and photoelectric transducer means being positioned at a location remote from said high frequency electrode means to avoid any significant electrical interference therefrom on said photoelectric transducer means, and
    a condenser lens located within said chamber and being connected to said first terminal of said optical fiberscope for collecting light emitted from the plasma within said chamber.

2. The apparatus as claimed in claim 1 wherein said high frequency electrode means comprises an electrode located within said chamber and an electrode located outside said chamber, said electrodes being connected respectively to said generator means.

3. The apparatus as claimed in claim 2 including means for moving said wafer table between said upper and lower positions.

4. The apparatus as claimed in any one of claims 1 to 3 and including a grounded cage of wire netting surrounding said chamber to shield said photoelectric transducer means from high frequency electric fields from said high frequency electrode means.

5. Plasma treatment apparatus for treatment of a semiconductor wafer comprising
    a plasma reaction chamber,
    a high frequency generator,
    high frequency electrode means connected to said generator for creating plasma within said chamber,
    means for monitoring the surface condition of the semiconductor wafer during plasma treatment thereof by monitoring the light intensity of the plasma, said means comprising,
    an optical fiberscope having first and second terminals, said first terminal being positioned to collect light from the plasma in said chamber, said second terminal being connected to a photoelectric transducer, said second terminal and said photoelectric transducer being positioned at a location sufficiently remote from said electrode means and chamber to avoid interference from an electric field created by the electrode means, and means for detecting changes in the electrical output of said photoelectric transducer to thereby detect changes in the intensity of the light of the plasma and to thereby monitor the extent of plasma treatment of the semiconductor wafer.

6. Apparatus according to claim 5 wherein a condenser lens is connected to said first terminal of said optical fibroscope so that from the plasma passes through said lens to said first terminal.

7. Apparatus according to claim 6 wherein at least a portion of said lens is within said reaction chamber.

8. Apparatus according to any one of claims 5 to 7 wherein said first terminal penetrates a wall of the reaction chamber.

9. Apparatus according to claim 5 wherein said chamber has an inlet for plasma forming gas and an outlet for connection to a vacuum source, and means for flowing said plasma forming gas to said inlet at a predetermined rate.

* * * * *